United States Patent
Han (10) Patent No.: US 12,449,733 B2
(45) Date of Patent: Oct. 21, 2025

(54) SUBSTRATE TREATING APPARATUS

(71) Applicant: SAMSUNG ELECTRONICS CO., LTD., Suwon-si (KR)

(72) Inventor: Seulgi Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 208 days.

(21) Appl. No.: 18/339,761

(22) Filed: Jun. 22, 2023

(65) Prior Publication Data

US 2024/0118621 A1 Apr. 11, 2024

(30) Foreign Application Priority Data

Oct. 11, 2022 (KR) .................... 10-2022-0129555

(51) Int. Cl.
  *G03F 7/16* (2006.01)
(52) U.S. Cl.
  CPC .................. *G03F 7/162* (2013.01)
(58) Field of Classification Search
  CPC . G03F 7/162; G03F 7/168; G03F 7/11; G03F 7/2041; G03F 7/70341; G01N 1/02; G01N 2021/1765; G01N 21/84; G01D 21/02; G06N 3/08; G06Q 50/10; H01L 21/6715; H01L 21/67017; H01L 21/67051; H01L 21/02068; H01L 2224/80894; H01L 2224/80895; H01L 2224/80896; H01L 2224/80986; H01L 24/89

See application file for complete search history.

(56) References Cited

U.S. PATENT DOCUMENTS

| | | | |
|---|---|---|---|
| 4,986,216 A * | 1/1991 | Ohmori | H01L 21/67069 118/725 |
| 7,238,624 B2 | 7/2007 | Shih | |
| 8,124,320 B2 | 2/2012 | Blalock | |
| 2001/0031147 A1 | 10/2001 | Takamori et al. | |
| 2002/0176936 A1 * | 11/2002 | Matsuyama | B05C 11/08 427/346 |
| 2004/0209201 A1 | 10/2004 | Nakano et al. | |
| 2007/0212884 A1 * | 9/2007 | Yamamoto | H01L 21/6715 257/E21.264 |

(Continued)

FOREIGN PATENT DOCUMENTS

| | | |
|---|---|---|
| KR | 20020079012 A | 10/2002 |
| KR | 100543439 B1 | 4/2006 |
| KR | 100787873 B1 | 12/2007 |

*Primary Examiner* — Deoram Persaud (74) *Attorney, Agent, or Firm* — Wolf, Greenfield & Sacks, P.C.

(57) ABSTRACT

A substrate treating apparatus includes a chamber having a gate through which a substrate is loaded into the chamber and unloaded from the chamber, a gas supply unit in an upper portion in the chamber and configured to supply gas into the chamber, a spin coater in a lower portion in the chamber and including a spin chuck configured to support and rotate the substrate on an upper surface thereof and a cup portion extending around the substrate and configured to collect and discharge a chemical liquid from the substrate, a chemical liquid supply unit configured to supply a chemical liquid onto the substrate, and a heater between the substrate and the gas supply unit and configured to heat the substrate.

20 Claims, 7 Drawing Sheets

(56) References Cited

U.S. PATENT DOCUMENTS

| | | | |
|---|---|---|---|
| 2011/0024399 A1* | 2/2011 | Kim | H01L 21/67751 |
| | | | 219/121.41 |
| 2018/0164689 A1* | 6/2018 | Sano | H01L 21/6719 |
| 2019/0066984 A1* | 2/2019 | Mungekar | H05B 1/0233 |
| 2019/0157116 A1* | 5/2019 | Jeon | B05C 11/08 |
| 2021/0090910 A1* | 3/2021 | Miya | H01L 21/67028 |
| 2022/0359243 A1* | 11/2022 | Naeki | H01L 21/67253 |
| 2024/0173751 A1* | 5/2024 | Park | G03F 7/38 |
| 2024/0198371 A1* | 6/2024 | Ha | B05B 15/25 |

* cited by examiner

SUBSTRATE TREATING APPARATUS

CROSS-REFERENCE TO RELATED APPLICATION(S)

This application claims benefit of priority to Korean Patent Application No. 10-2022-0129555 filed on Oct. 11, 2022 in the Korean Intellectual Property Office, the disclosure of which is incorporated herein by reference in its entirety.

BACKGROUND

The present inventive concept relates to a substrate treating apparatus.

In a manufacturing process of semiconductor devices, a photolithography process is used to form patterns of various shapes and structures. The photolithography process may include a coating process of coating a photoresist on a surface of a substrate to form a photoresist film, an exposure process of exposing the coated photoresist film to light, and a developing process of developing the exposed photoresist film to form a circuit pattern. The coating process is performed as a spin coating process to form a film having a predetermined thickness by supplying a highly viscous photoresist solution to a rotating substrate.

SUMMARY

An aspect of the present inventive concept is to provide a substrate treating apparatus having improved process efficiency.

According to an aspect of the present inventive concept, a substrate treating apparatus includes: a chamber having a gate through which a substrate is loaded into the chamber and unloaded from the chamber; a gas supply unit in an upper portion of the chamber and configured to supply gas into the chamber; a spin coater in a lower portion of the chamber and including a spin chuck configured to support and rotate the substrate on an upper surface thereof, and a cup portion extending around the substrate and configured to collect and discharge a chemical liquid from the substrate; a chemical liquid supply unit configured to supply the chemical liquid onto the substrate; and a heater between the substrate and the gas supply unit and configured to heat the substrate.

According to another aspect of the present inventive concept, a substrate treating apparatus includes: a chamber; a spin coater in an upper portion of the chamber and including a spin chuck configured to support and rotate a substrate on an upper surface thereof; a chemical liquid supply unit on one side of the spin coater and configured to supply a chemical liquid onto the substrate; and a heater above the substrate that is configured to heat the substrate, wherein the heater has an inclined heating surface that faces the substrate.

According to another aspect of the present inventive concept, a substrate treating apparatus includes: a chamber; a spin coater in an upper portion of the chamber and including a spin chuck configured to support and rotate a substrate on an upper surface thereof; a chemical liquid supply unit configured to supply a chemical liquid onto the substrate; a heater above the substrate and configured to heat the substrate; and a controller configured to control operation of the spin coater, the chemical liquid supply unit, and the heater, wherein the controller controls the heater to heat the substrate during a time that overlaps at least a portion of a time that the spin chuck is rotating the substrate.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
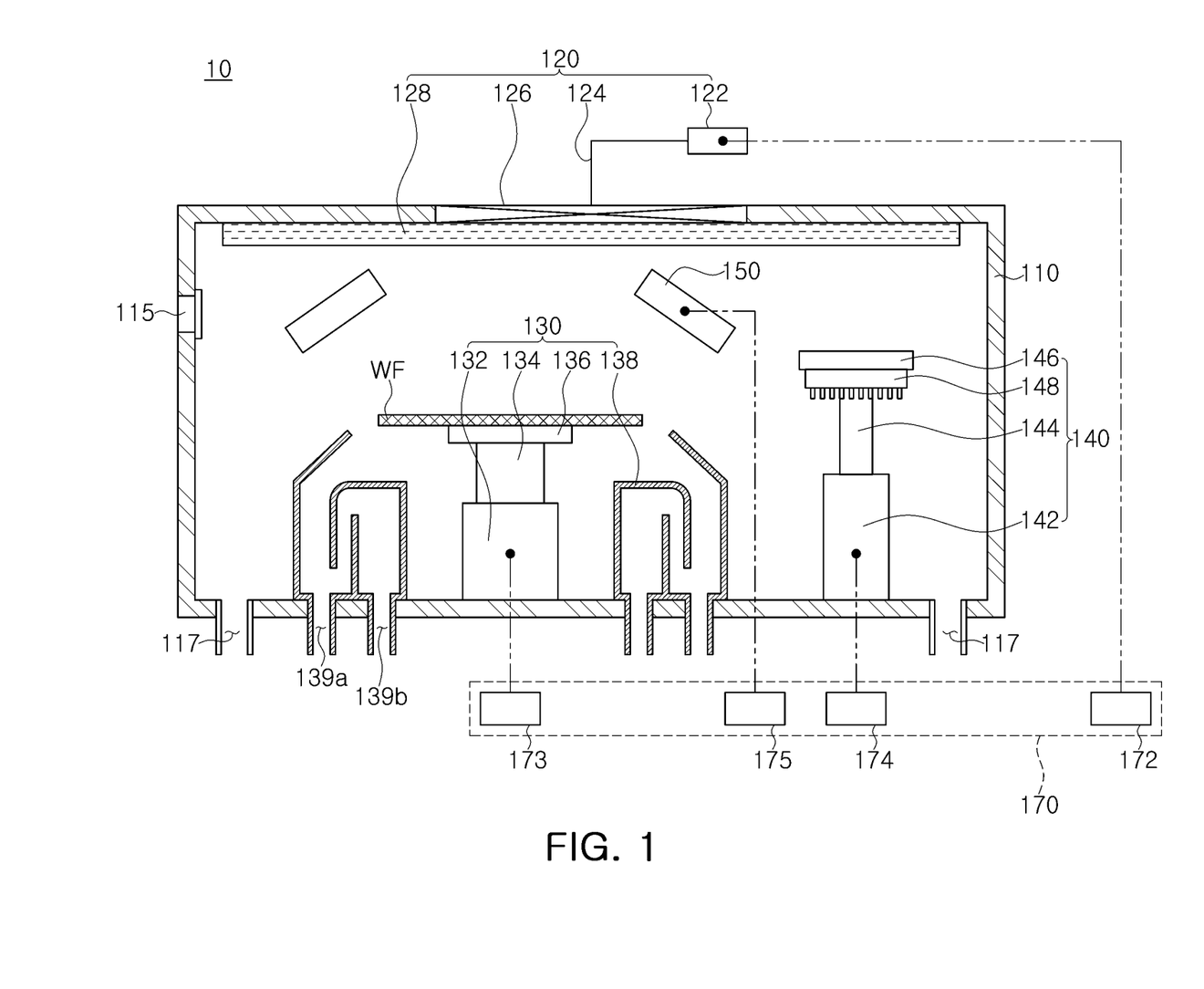
FIG. 1 is a schematic cross-sectional view of a substrate treating apparatus according to example embodiments.

FIG. 1 is a schematic cross-sectional view of a substrate treating apparatus according to example embodiments.

Referring to FIG. 1, a substrate treating apparatus 10 may include a chamber 110, a gas supply unit 120 disposed above the chamber 110 and configured to supply gas to the inside of the chamber 110, a spin coater 130 installed at a lower portion of the chamber 110 and configured to support and rotate a substrate WF which is a target to be treated, a chemical liquid supply unit 140 configured to supply a chemical liquid to an upper surface of the substrate WF, a heater 150 disposed above the substrate WF and configured to heat the substrate WF, and a controller 170 configured to control operation of these components. The substrate treating apparatus 10 may be a spin coater module applying a chemical liquid on the substrate WF to form a coating film thereon. In the present example embodiment, the substrate treating apparatus 10 will be described as an apparatus for coating the substrate WF with a photoresist film using a photoresist solution as a chemical liquid, for example.

The chamber 110 is a housing providing a space in which a coating process is performed, and may provide a sealed internal space in which the substrate WF is treated. For example, the chamber 110 may be provided to have a cylindrical or hexahedral shape having an internal space of a certain size. A gate 115 may be disposed in one side of the chamber 110, which is a passage through which the substrate WF is brought into the chamber 110 or the substrate WF, after processing, is taken out of the chamber 110. A gate door may be provided at the gate 115 to block the internal space of the chamber 110 from the outside (i.e., an environment external to the chamber 110) when the substrate WF is loaded in, thereby forming a closed space inside the chamber 110. However, in example embodiments, a specific shape of the gate 115 may be variously changed. For example, in some example embodiments, an upper region of the chamber 110 may function as a gate and may be separated from a lower region of the chamber 110 to be opened, thereby opening the chamber 110. External exhaust ports 117 may be disposed on a bottom surface of the chamber 110. Gases due to a descending current of air formed in the closed space in the chamber 110 may be discharged to the outside through the external exhaust ports 117. The external exhaust ports 117 may be connected to an external exhaust unit, such as a discharge pump, to form a descending current of air in the chamber 110. In some example embodiments, a chemical liquid sprayed may also be discharged to the outside along with the gas through the external exhaust ports 117.

The substrate WF may be a substrate for manufacturing a semiconductor device, and may be, for example, a wafer. The substrate WF may include a semiconductor material. For example, the substrate WF may be in a state in which a portion of a semiconductor device is formed on the wafer.

The gas supply unit 120 may be installed in an upper region or at the top of the chamber 110. The gas supply unit 120 may supply a specific gas and/or air into the chamber 110. For example, the gas supply unit 120 may supply nitrogen ($N_2$) and air into the chamber 110. Humidity inside the chamber 110 may be lowered by further supplying nitrogen ($N_2$) in addition to air. Accordingly, a low-humidity environment advantageous for drying the chemical liquid applied on the substrate WF may be created in the chamber 110. The gas flowing from the top to the bottom of the chamber 110 by the gas supply unit 120 is discharged through the external exhaust ports 117, so that a descending current of air flowing from the top to the bottom of the chamber 110 may be generated in the chamber 110.

The gas supply unit 120 may include a gas supply source 122, a gas supply line 124, a fan unit 126, and a filter unit 128. Gas provided from the gas supply source 122 may be supplied to the chamber 110 along the gas supply line 124. The fan unit 126 may be disposed in the center of the top of the chamber 110 to supply gas downwardly. In some example embodiments, the fan unit 126 may be replaced by another supply member, such as a shower head. The filter unit 128 may be disposed in an upper portion of the chamber 110 to remove impurities in the gas before the gas is supplied to the chamber 110. The filter unit 128 may filter the gas to have a degree of cleanliness that meets standard requirements of a semiconductor manufacturing process. For example, the filter unit 128 may include an ultra-low penetration air (ULPA) filter.

The spin coater 130 may be disposed in a lower portion of the chamber 110 to rotate the substrate WF fixed on an upper surface thereof. The spin coater 130 may include a driving unit 132, a rotating shaft structure 134 driven by power applied from the driving unit 132, a spin chuck 136 disposed on the rotating shaft structure 134 to fix (i.e., secure/support) and rotate the substrate WF, and a cup portion 138 disposed to extend around the substrate WF, as illustrated.

The driving unit 132 may include, for example, a motor. The rotating shaft structure 134 may include a slender member extending downwardly from the bottom of the spin chuck 136. Power from the driving unit 132 may be transmitted to the spin chuck 136 through the rotating shaft structure 134. For example, the rotating shaft structure 134 may transfer a lifting motion in a longitudinal direction and a rotational motion about a central axis to the spin chuck 136.

The spin chuck 136 may fix (i.e., secure/support) the substrate WF to the upper surface thereof to rotate the substrate WF. The spin chuck 136 may fix the substrate WF by vacuum suction, for example. The spin chuck 136 may rotate at a constant rotational speed, and may ascend or descend in a vertical direction when the substrate WF is loaded or unloaded. A thickness of a film formed on the substrate WF may be controlled according to the rotational speed of the spin chuck 136.

The cup portion 138 may collect the chemical liquid overflowing from the edge of the substrate WF and discharge the collected chemical liquid. The cup portion 138 may have a bowl shape surrounding the substrate WF. In the illustrated embodiment, the cup portion 138 includes an outer peripheral wall with an inwardly angled upper portion, a middle peripheral wall that is radially inward from the outer peripheral wall and generally concentric with the outer peripheral wall, and an inner peripheral wall that is radially inward from the middle peripheral wall. The inner peripheral wall has a portion that extends over the middle peripheral wall, as illustrated in FIG. 1. However, embodiments of the present inventive concept are not limited to the illustrated configuration of the cup portion 138. Relative heights of the substrate WF and an upper end of the cup portion 138 may be variously changed in example embodiments. For example, in some example embodiments, the upper end of the cup portion 138 may be located to be higher than an edge region of the substrate WF. The cup portion 138 may have an internal space of a certain size, may be open in an upper portion, and may have first and second discharge lines 139a and 139b provided at the bottom. The chemical liquid supplied onto the substrate WF may be discharged externally along the first discharge lines 139a provided at the bottom of the cup portion 138 along with an air flow. The gas moved together with the chemical liquid may be discharged through the second discharge lines 139b. A pressing unit for inducing a descending flow of gas may be further provided below the cup portion 138. However, the shape of the cup portion 138 of FIG. 1 is an example and may be changed in various forms in the example embodiments.

The chemical liquid supply unit 140 may supply a chemical liquid, such as a photoresist solution, onto the upper surface of the substrate WF. The chemical liquid supply unit 140 may include a base unit 142 fixed to the chamber 110, a rotating unit 144 on the base unit 142, an arm unit 146 extending horizontally from the rotating unit 144, and a nozzle 148 mounted at the end of the arm unit 146.

The base unit 142 may include a chemical liquid supply unit or may be connected to the chemical liquid supply unit to receive a chemical liquid. The rotating unit 144 may be rotated to adjust an elongation direction of the arm unit 146. The arm unit 146 may be elongated from the rotating unit 144 and move onto the upper surface of the substrate WF. The nozzle 148 may supply a chemical liquid, such as photoresist, onto the substrate WF. In an example embodiment, the nozzle 148 may supply a photoresist having a high viscosity, for example, a viscosity of about 600 centipoise (cP) or less, for example, about 1 cP to about 600 cP.

The heater 150 may be located above the substrate WF and the spin coater 130 in the chamber 110 and may be located below the gas supply unit 120. The heater 150 may be particularly located on an edge region of the substrate WF. The heater 150 may or may not overlap a portion of the spin chuck 136 in the vertical direction. The heater 150 may overlap a portion of the substrate WF in the vertical direction.

The heater 150 may serve to dry the chemical liquid applied on the substrate WF. The chemical liquid may be applied to be relatively thick on the edge region of the substrate WF due to rotation of the spin chuck 136. Accordingly, in order to enhance drying of the chemical liquid applied on the edge region, the heater 150 may be disposed to have an inclined heating surface that faces the substrate WF. The heater 150 may include a heating plate and may have a temperature range of about 60° C. to about 170° C., for example, about 80° C. to about 150° C. However, the heating temperature of the heater 150 may be controlled according to the type of chemical liquid.

The controller 170 may include a gas supply controller 172 configured to control operation of the gas supply unit 120, a spin controller 173 configured to control operation of the spin coater 130, a chemical liquid supply controller 174 configured to control operation of the chemical liquid supply unit 140, and a heater controller 175 configured to control operation of the heater 150.

The gas supply controller 172 may control a supply flow rate and supply time of gas, for example, nitrogen ($N_2$), in consideration of humidity in the chamber 110. The spin controller 173 may adjust a rotation speed and rotation time of the rotating structure 134 and the spin chuck 136 according to the type of chemical liquid supplied onto the substrate WF. The chemical liquid supply controller 174 may control a position of the arm unit 146 and the type and amount of the chemical liquid supplied onto the substrate WF. For example, the chemical liquid supply unit 140 may be controlled to supply a photoresist solution onto the substrate WF by the chemical liquid supply controller 174. The heater controller 175 may control a temperature and heating time of the heater 150. For example, the heater controller 175 may control the heater 150 such that an operating time of the rotating structure 134 and the spin chuck 136 overlaps at least a portion of an operating time of the heater 150 (i.e., a time that the heater 150 is radiating heat to heat the substrate). This will be described in more detail with reference to FIG. 6 below.

According to the substrate treating apparatus 10, nitrogen ($N_2$) is supplied to the chamber 110 by the gas supply unit 120 to create a low-humidity environment, and a chemical liquid film coated on the substrate WF may be at least partially dried by the heater 150. Accordingly, a drying time of the chemical liquid film may be minimized without increasing a process space. In addition, even when viscosity of the chemical liquid is relatively high, thickness distribution may be minimized by improving a profile of the chemical liquid film.

Figure 2A:
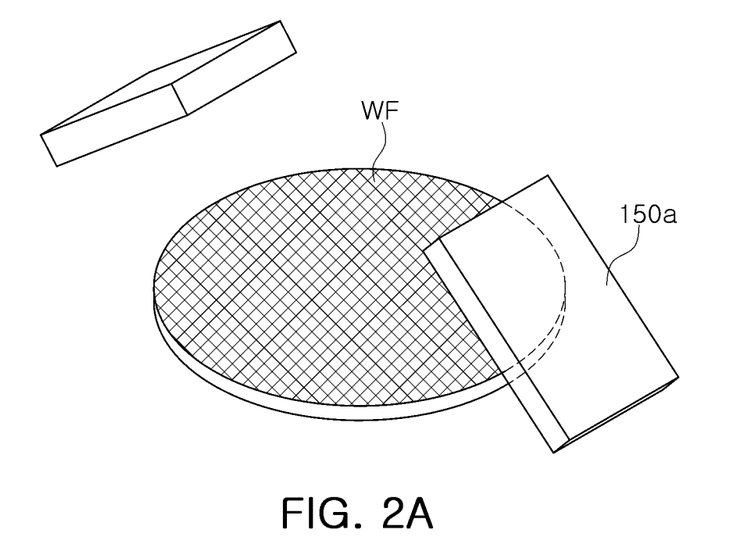
FIGS. 2A and 2B are perspective views illustrating a heater of a substrate treating apparatus according to example embodiments.
Figure 2B:
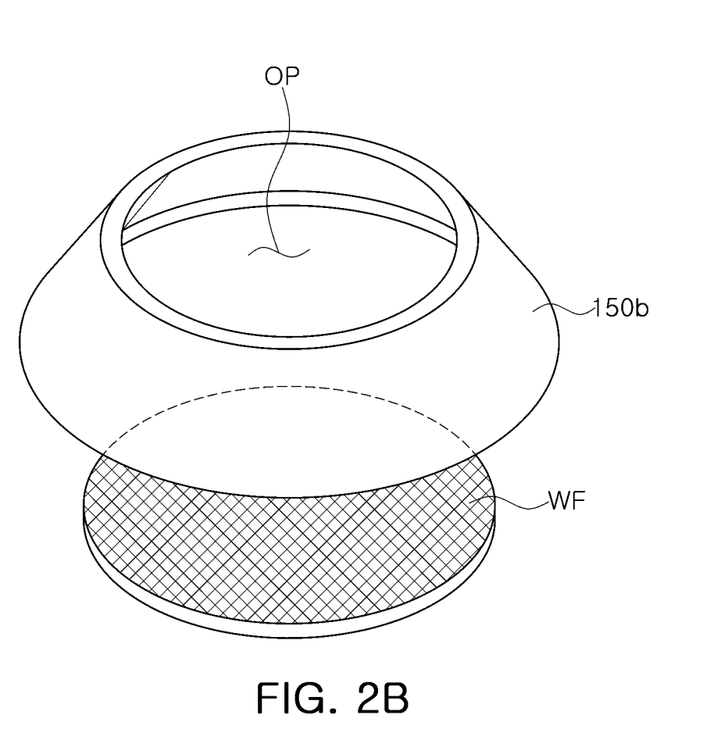

FIGS. 2A and 2B are perspective views illustrating a heater of a substrate treating apparatus according to example embodiments. FIGS. 2A and 2B illustrate example embodiments of a heater 150 of the substrate treating apparatus 10 of FIG. 1.

Referring to FIG. 2A, a heater 150a may include two plates respectively disposed on both sides of the substrate WF or the spin chuck 136 (refer to FIG. 1). The heater 150a may be inclined toward the substrate WF. When the heater 150a operates while the substrate WF rotates, heat may be uniformly transferred to an outer circumferential surface of the substrate WF even when the heaters 150a are disposed on both sides in one direction. In particular, the heater 150a may be disposed to be adjacent to the edge region of the substrate WF so that a relatively large amount of heat is transferred (i.e., radiated) to the edge region.

Referring to FIG. 2B, a heater 150b may have an annular shape and may be circularly disposed along the circumference of the substrate WF or the spin chuck 136, as illustrated in FIG. 1. In the illustrated embodiment, the heater 150b has a frustoconical shape with an opening OP in a central region thereof. Also, in the present example embodiment, the surface of the heater 150b from which heat radiates (i.e., the "heating surface" is oriented to face the substrate WF, as illustrated. Since the heating surface of the heater 150b is positioned above and directed toward the peripheral edge region of the substrate WF, a relatively large amount of heat may be transferred to the entire peripheral edge region of the substrate WF.

Figure 3:
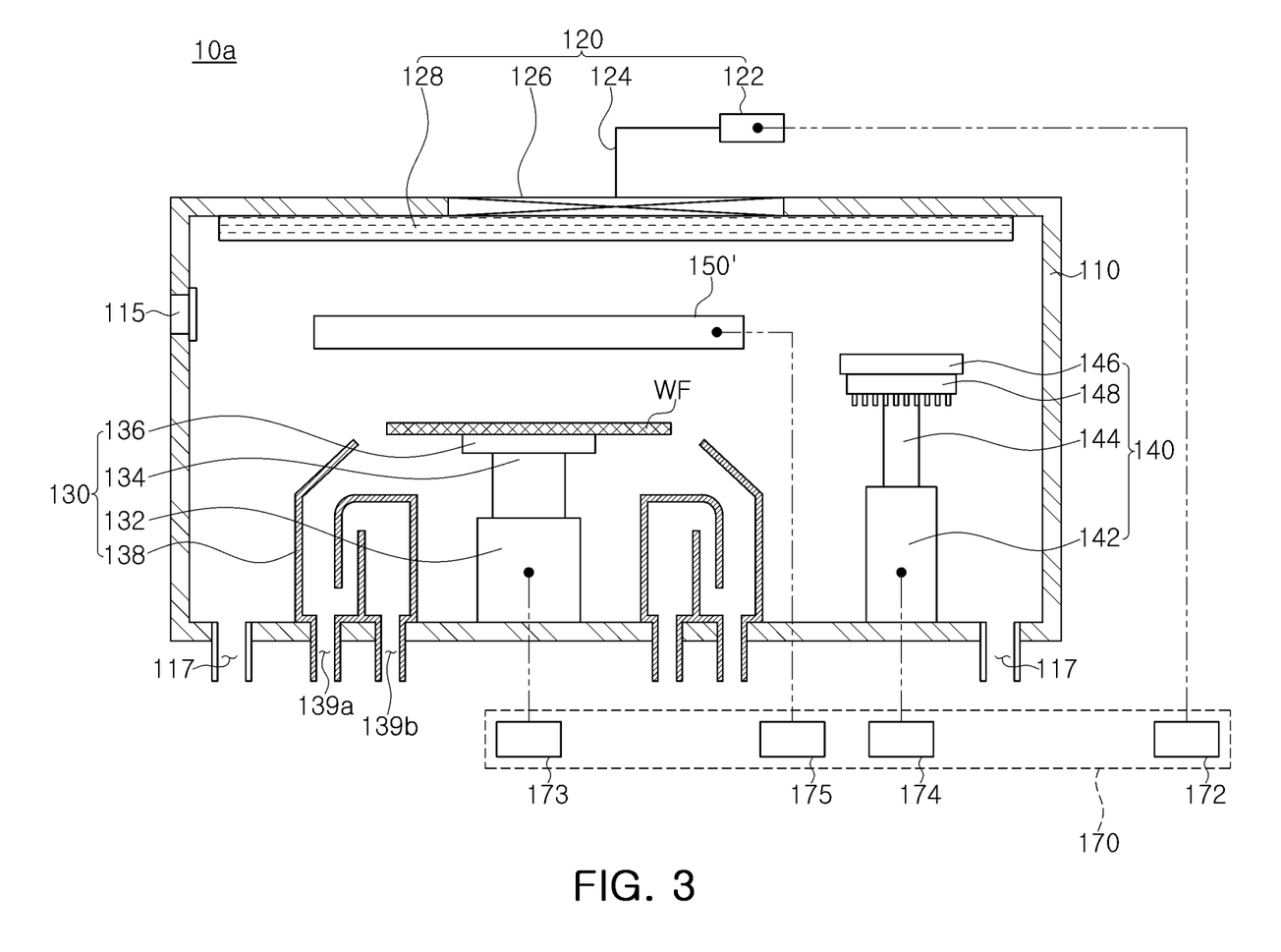
FIG. 3 is a schematic cross-sectional view of a substrate treating apparatus according to example embodiments.

FIG. 3 is a schematic cross-sectional view of a substrate treating apparatus according to example embodiments.

Referring to FIG. 3, the arrangement of a heater 150' in the substrate treating apparatus 10a may be different from that in the example embodiment of FIG. 1. The heater 150' may be disposed above the substrate WF to overlap the entirety of the spin chuck 136 in a vertical direction. The heater 150' may be disposed to overlap the entire substrate WF along the vertical direction. For example, the heater 150' may have a circular or polygonal plate shape.

Figure 4A:
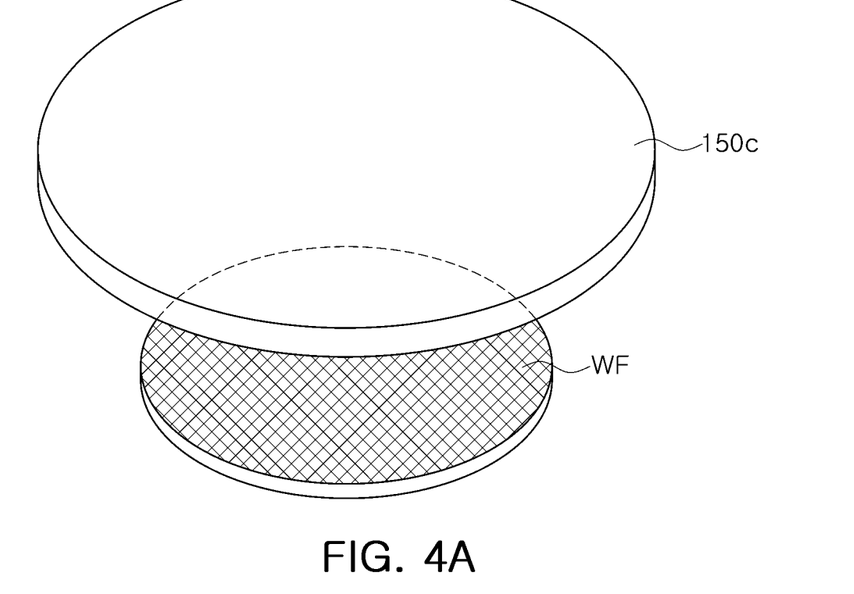
FIGS. 4A and 4B are perspective views illustrating a heater of a substrate treating apparatus according to example embodiments.
Figure 4B:
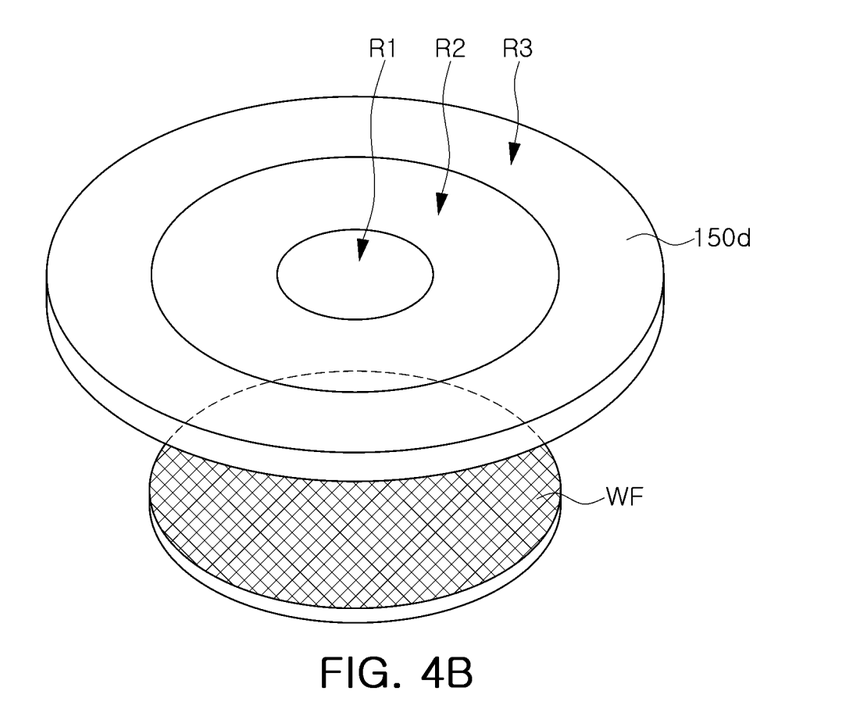

FIGS. 4A and 4B are perspective views illustrating a heater of a substrate treating apparatus according to example embodiments. FIGS. 4A and 4B illustrate example embodiments of the heater 150' of the substrate treating apparatus 10a of FIG. 3.

Referring to FIG. 4A, a heater 150c may be disposed to have a circular plate shape above the substrate WF or the spin chuck 136 (refer to FIG. 1). The heater 150c may have a lower surface parallel to the upper surface of the substrate WF. In FIG. 4A, the heater 150c has upper and lower surfaces parallel to each other, but is not limited thereto. Also, in some example embodiments, the heater 150c may have a dome shape facing the substrate WF.

Referring to FIG. 4B, the heater 150d may have a circular plate shape and may include a plurality of first to third heating regions R1, R2, and R3 sequentially disposed from the center (i.e., the first, second, and third heating regions R1, R2, R3 are concentric). The first to third heating regions R1, R2, and R3 may generate heat at different temperatures from each other. For example, a heating temperature of the first heating region R1 may be a first temperature, a heating temperature of the second heating region R2 may be a second temperature higher than the first temperature, and a heating temperature of the third heating region R3 may be a third temperature higher than the second temperature. For example, the first temperature may range from about 60° C. to about 80° C., the second temperature may range from about 80° C. to about 100° C., and the third temperature may range from about 130° C. to about 170° C. As such, the heating temperatures of the heater 150d may increase from the center to the edge of the substrate WF. Accordingly, a relatively large amount of heat may be transferred to the edge region of the substrate WF, as compared with other regions of the substrate WF. In example embodiments, the number of heating regions may be variously changed within a range of two or more (i.e., there may be two or more concentric heating regions).

Figure 5:
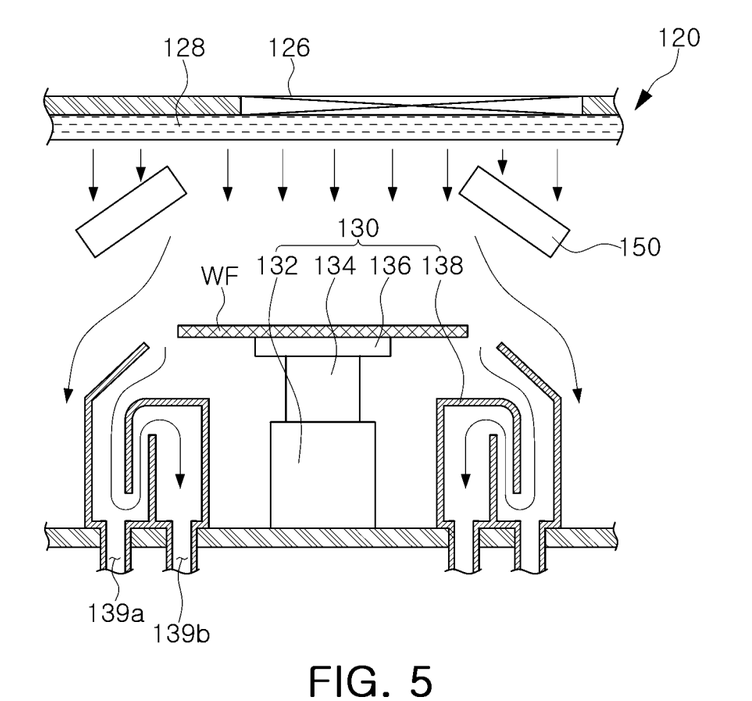
FIG. 5 is a schematic diagram illustrating an operation of a substrate treating apparatus according to example embodiments.

FIG. 5 is a schematic diagram illustrating an operation of a substrate treating apparatus according to example embodiments.

Referring to FIG. 5, a flow of gas through the gas supply unit 120 is indicated by the arrows. The gas supply unit 120 may be controlled to supply nitrogen ($N_2$), or air and nitrogen ($N_2$) by the gas supply controller 172 (refer to FIG. 1). The supplied gas may descend toward the substrate WF and may be exhausted downwardly through the external exhaust ports 117 and the second exhaust lines 139b. The gas supply controller 172 may control temperature and humidity in the chamber 110 (refer to FIG. 1) by controlling the temperature and flow rate of nitrogen ($N_2$) and/or air being supplied. The gas supply controller 172 may adjust a supply amount of nitrogen ($N_2$) so that the chamber 110 has a relatively low humidity environment.

Figure 6:
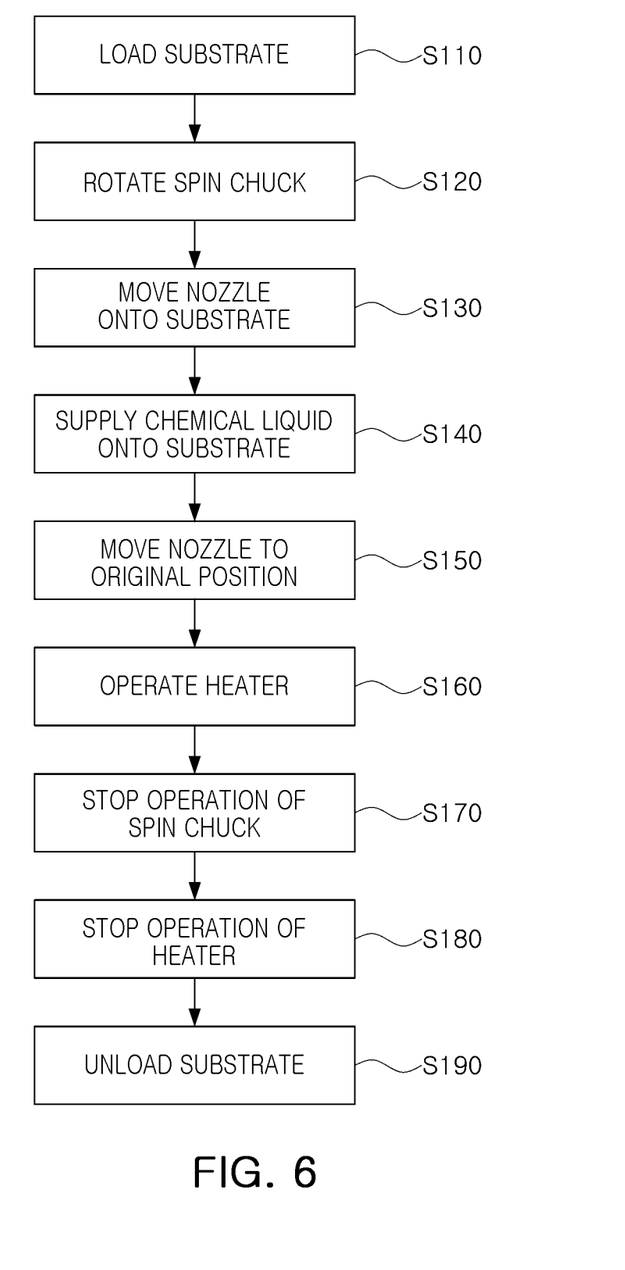
FIG. 6 is a flowchart illustrating an operation of a substrate treating apparatus according to example embodiments.

FIG. 6 is a flowchart illustrating an operation of a substrate treating apparatus according to example embodiments.

Figure 7A:
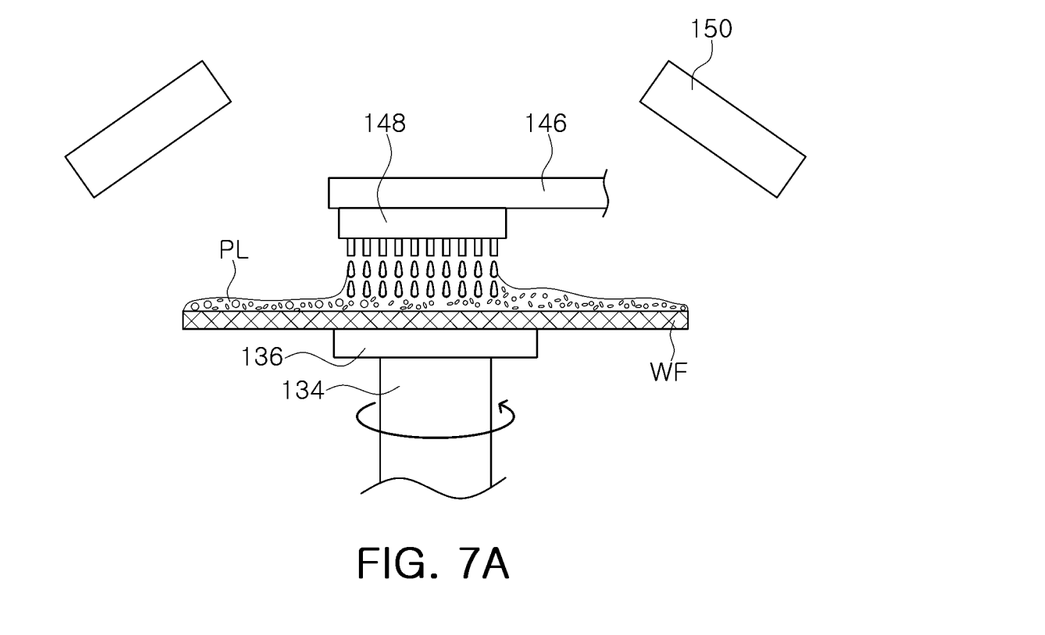
FIGS. 7A and 7B are schematic diagrams illustrating an operation of a substrate treating apparatus according to example embodiments.
Figure 7B:
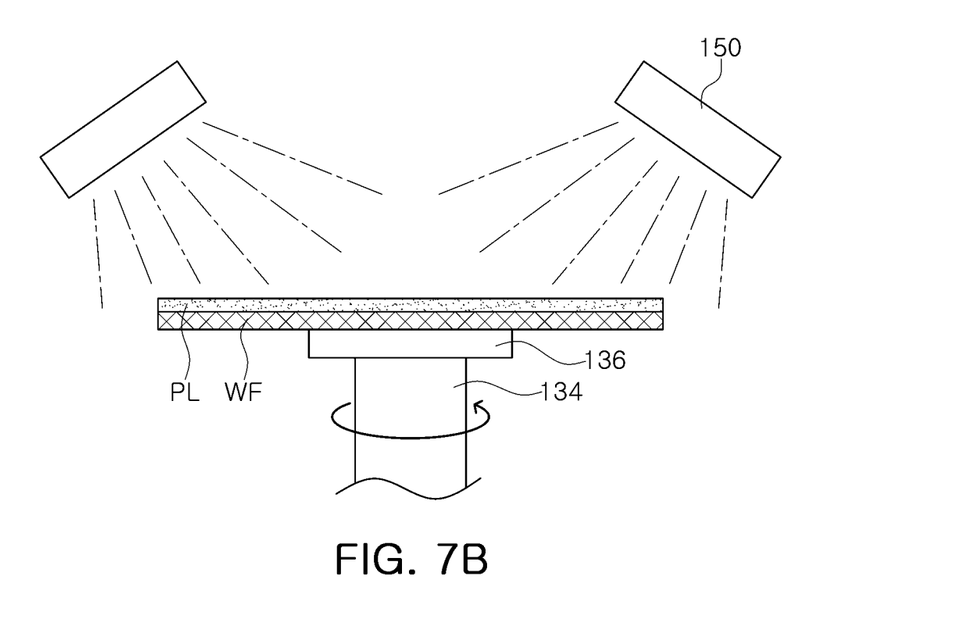

FIGS. 7A and 7B are schematic diagrams illustrating an operation of a substrate treating apparatus according to example embodiments.

Referring to FIG. 6 together with FIG. 1, first, the substrate WF may be loaded into the chamber 110 and loaded on the spin chuck 136 (S110). The substrate WF may be carried in through the gate 115 by, for example, a robot arm and fixed on the spin chuck 136. Nitrogen ($N_2$), or air and nitrogen ($N_2$) may be supplied to the chamber 110 by the gas supply unit 120 before or after the substrate WF is loaded into the chamber 110.

Next, the rotating shaft structure 134 and the spin chuck 136 may be rotated by the spin controller 173 (S120). Accordingly, the substrate WF on the spin chuck 136 may be rotated at a constant speed.

Next, referring to FIG. 7A, as the arm unit 146 is moved by the chemical liquid supply controller 174, the nozzle 148 may be moved over the substrate WF (S130) and the chemical liquid may be supplied to the substrate WF through the nozzle 148 (S140). A photoresist layer PL may be formed on the substrate WF by the supplied chemical liquid. In an example embodiment, the chemical liquid may be, for example, a photoresist solution having a viscosity of about 500 cP to about 600 cP, and the photoresist layer PL may be formed to have a thickness of about 14 microns ($\mu$m) to about 16 $\mu$m. Since the chemical liquid is supplied while the shaft structure 134 and the spin chuck 136 are rotating, the supplied chemical liquid may be applied to the entire upper surface of the substrate WF (e.g., due to centrifugal force generated by the rotating spin chuck 136). After supplying the chemical liquid, the nozzle 148 may be moved back to an original position thereof (S150).

Next, referring to FIG. 7B together, the heater 150 may be operated (S160). An operating time of the heater 150 controlled by the heater controller 175 may be after the supply of the chemical liquid through the nozzle 148 is completed, for example, after the nozzle 148 is moved to the original position, but is not limited thereto. The heater 150 may start a heating operation, while the spin chuck 136 is rotating. That is, the operating time of the heater 150, that is, a heating time, may be controlled to overlap a portion of the operating time, that is, a rotation time of the spin chuck 136. For example, in some example embodiments, the entire operating time of the heater 150 may be included within the operating time of the spin chuck 136.

The photoresist layer PL on the substrate WF may be heated by the heater 150, and the photoresist layer PL may be dried as a solvent thereof is removed from the photoresist layer PL. A relatively large amount of heat from the heater 150 may be transferred to the edge region of the substrate WF. Even when the photoresist film PL is relatively thick at the edge region due to the rotational operation of the spin chuck 136, the heater 150 may efficiently dry the edge region, so that a total process time for drying the photoresist film PL may be minimized.

Next, the operation of the spin chuck 136 may be stopped (S170), and the operation of the heater 150 may be stopped (S180) (i.e., the heater stops radiating heat). According to example embodiments, the operation of the spin chuck 136 may first be stopped (i.e., the spin chuck stops rotating), then the operation of the heater 150 may be stopped, or the operation of the spin chuck 136 and the operation of the heater 150 may be simultaneously stopped. In the former case, even after the operation of the spin chuck 136 is stopped, the heater 150 may be further operated for a predetermined time. The timing of stopping or ending the operation of the heater 150 may be determined in consideration of a material, thickness, or the like of the photoresist layer PL. A total operating time of the heater 150 (i.e., a time that the heater 150 is radiating heat) may be shorter than a total operating time of the spin chuck 136, but is not limited thereto.

Next, the substrate WF on which the photoresist layer PL is formed may be unloaded from the chamber 110 (S190). The unloaded substrate WF may be moved to a chamber of another device, and a soft bake process may be performed on the substrate WF. According to the present example embodiment, even in the case of forming a photoresist film PL having a relatively high viscosity and a thick thickness, since the heating process by the heater 150 is performed during the spin coating process in the substrate treating apparatus 10, the process time in the soft bake process may be shortened and a thickness profile according to regions of the photoresist layer PL may be improved. In addition, since the heating process by the heater 150 is performed in the same chamber 110 without moving to a separate chamber after the spin coating process, a process time may be shortened without requiring a separate space. In some example embodiments, the soft bake process may be omitted.

After the soft bake process is performed, an exposure process using a photomask may be performed on the substrate WF, and a development process may be performed to pattern the photoresist layer PL.

The substrate treating apparatus having improved process efficiency may be provided by including the gas supply unit and the heater disposed on the spin coater.

While example embodiments have been shown and described above, it will be apparent to those skilled in the art that modifications and variations could be made without departing from the scope of the present inventive concept as defined by the appended claims.

What is claimed is:

1. A substrate treating apparatus, comprising:
a chamber comprising a gate through which a substrate is loaded into the chamber and unloaded from the chamber;
a gas supply unit in an upper portion of the chamber and configured to supply gas into the chamber;
a spin coater in a lower portion of the chamber, the spin coater comprising a spin chuck configured to support and rotate the substrate on an upper surface thereof, and a cup portion extending around the substrate and configured to collect and discharge a chemical liquid from the substrate;
a chemical liquid supply unit configured to supply the chemical liquid onto the substrate; and
a heater between the substrate and the gas supply unit and configured to heat the substrate.

2. The substrate treating apparatus of claim 1, further comprising:
a heater controller configured to control operation of the heater,
wherein the heater controller is configured to control the heater so that the heater heats the substrate during a time that overlaps with at least a portion of a time that the spin chuck is rotating the substrate.

3. The substrate treating apparatus of claim 2, wherein the heater controller is configured to control the heater so that the heater heats the substrate after the spin chuck has stopped rotating the substrate.

4. The substrate treating apparatus of claim 1, wherein the heater generates heat in a temperature range of about 80° C. to about 150° C.

5. The substrate treating apparatus of claim 1, wherein the heater comprises an inclined heating surface, and wherein the heater is positioned so that the inclined heating surface faces the substrate.

6. The substrate treating apparatus of claim 5, wherein the heater has an annular shape with a heating surface that faces a peripheral edge of the substrate.

7. The substrate treating apparatus of claim 1, wherein the heater has a circular plate shape.

8. The substrate treating apparatus of claim 7, wherein the heater comprises a plurality of concentric heating regions, each heating region configured to generate heat at different temperatures.

9. The substrate treating apparatus of claim 1, further comprising:
 a gas supply controller configured to control a flow rate of the gas supplied by the gas supply unit into the chamber, and
 wherein the gas comprises nitrogen ($N_2$).

10. The substrate treating apparatus of claim 1, wherein the gas supply unit comprises a filter unit having an ultra-low penetration air (ULPA) filter.

11. The substrate treating apparatus of claim 1, wherein the chemical liquid supply unit is configured to supply a photoresist solution onto the substrate.

12. The substrate treating apparatus of claim 11, wherein the photoresist solution has a viscosity of about 600 cP or less.

13. A substrate treating apparatus, comprising:
 a chamber;
 a spin coater in a lower portion of the chamber and comprising a spin chuck configured to support and rotate a substrate on an upper surface thereof;
 a chemical liquid supply unit on one side of the spin coater and configured to supply a chemical liquid onto the substrate; and
 a heater above the substrate that is configured to heat the substrate, wherein the heater comprises an inclined heating surface, and wherein the inclined heating surface faces the substrate.

14. The substrate treating apparatus of claim 13, wherein the heater has an opening located above a center of the spin chuck.

15. The substrate treating apparatus of claim 13, further comprising a gas supply unit in an upper portion of the chamber and configured to supply a gas containing nitrogen ($N_2$) into the chamber.

16. The substrate treating apparatus of claim 15, wherein the heater is located between the gas supply unit and the spin coater.

17. The substrate treating apparatus of claim 13, further comprising:
 a heater controller configured to control operation of the heater,
 wherein the heater controller controls the heater to heat the substrate during a time that overlaps at least a portion of a time that the spin chuck is rotating the substrate.

18. The substrate treating apparatus of claim 17, wherein the heater controller is configured to operate the heater for an operating time that is shorter than an operating time of the spin chuck.

19. A substrate treating apparatus, comprising:
 a chamber;
 a spin coater in a lower portion in the chamber and comprising a spin chuck configured to support and rotate a substrate on an upper surface thereof;
 a chemical liquid supply unit configured to supply a chemical liquid onto the substrate;
 a heater above the substrate and configured to heat the substrate; and
 a controller configured to control operation of the spin coater, the chemical liquid supply unit, and the heater,
 wherein the controller controls the heater to heat the substrate during a time that overlaps at least a portion of a time that the spin chuck is rotating the substrate.

20. The substrate treating apparatus of claim 19, wherein the controller controls the heater to heat the substrate after the chemical liquid is supplied to the substrate by the chemical liquid supply unit.

\* \* \* \* \*